United States Patent
Iida

(10) Patent No.: US 8,192,207 B2
(45) Date of Patent: Jun. 5, 2012

(54) FEMALE CIRCUIT BOARD HAVING NON-CIRCULAR CONDUCTION PORTIONS AND CONFORMAL TO INSERTION PORTIONS

(75) Inventor: Mituru Iida, Matsusaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/034,066

(22) Filed: Feb. 24, 2011

(65) Prior Publication Data

US 2011/0212631 A1 Sep. 1, 2011

(30) Foreign Application Priority Data

Feb. 26, 2010 (JP) ................. 2010-041598

(51) Int. Cl.
*H01R 12/00* (2006.01)

(52) U.S. Cl. ........................................ 439/67

(58) Field of Classification Search .............. 439/65–67, 439/82

See application file for complete search history.

(56) References Cited

U.S. PATENT DOCUMENTS

| | | | | |
|---|---|---|---|---|
| 6,030,234 A | * | 2/2000 | Berg et al. | 439/67 |
| 6,086,384 A | * | 7/2000 | Fuerst et al. | 439/67 |
| 6,490,168 B1 | * | 12/2002 | Rochowicz et al. | 361/784 |
| 6,493,932 B1 | * | 12/2002 | Haba | 29/840 |
| 7,785,113 B2 | * | 8/2010 | Mizoguchi | 439/67 |
| 2009/0233465 A1 | | 9/2009 | Mizoguchi | |

FOREIGN PATENT DOCUMENTS

JP 4059522 9/2009

* cited by examiner

*Primary Examiner* — Chandrika Prasad

(74) *Attorney, Agent, or Firm* — Bacon & Thomas, PLLC

(57) ABSTRACT

A female circuit board for use with a male circuit board has electrically conductive projections. The female circuit board includes a flexible insulating film. The flexible insulating film includes insertion portions into which the conductive projections of the male circuit board are allowed to be inserted. Each of the insertion portions includes a plurality of slits communicating with each other at the center of each of the insertion portions. The flexible insulating film further includes electrically conduction portions for making contact with the conductive projections to come into conduction with the male circuit board. The conduction portions are disposed around the insertion portions on the surface of the female circuit board facing the male circuit board when the female circuit board is in contact with the male circuit board. The conduction portions conform in shape to the insertion portions.

14 Claims, 9 Drawing Sheets

FEMALE CIRCUIT BOARD HAVING NON-CIRCULAR CONDUCTION PORTIONS AND CONFORMAL TO INSERTION PORTIONS

FIELD OF THE INVENTION

The present invention relates to a female circuit board for use in small-size electronic devices and a connector assembly including a female circuit board and a male circuit board.

BACKGROUND OF THE INVENTION

In recent years, a connector assembly is used to interconnect two printed wiring boards in electronic devices such as a cellular phone or a digital camera.

As shown in FIG. 9, there has been conventionally known a method of mechanically and electrically interconnecting a first circuit board 8 and a second circuit board 9 having surfaces at least partially facing each other (see, e.g., Japanese Patent No. 4059522).

Electrically conductive projections 81a are formed on one surface of the first circuit board 8. The second circuit board 9 includes a flexible insulation film 92 having a plurality of substantially cross-shaped in-plane slit portions 9b into which the conductive projections 81a of the first circuit board 8 are to be inserted. Pad portions 9c whose outer circumference has a circular shape as shown in FIG. 10 are formed around the slit portions 9b. The pad portions 9c come into conduction with the circuit patterns 9a of the second circuit board 9 and the conductive projections 81a of the first circuit board 8. The second circuit board 9 further includes a reinforcing plate 9e made from, e.g., a substantially flat metal plate or insulating plate and bonded to the other surface of the second circuit board 9. The reinforcing plate 9e has a plurality of insertion holes 9d formed in corresponding portions to the slit portions 9b.

The conductive projections 81a of the first circuit board 8 are inserted into the slit portions 9b at one side of the second circuit board 9. Thus, the conductive projections 81a are fitted to and coupled with the slit portions 9b to come into conduction with the pad portions 9c, whereby the first circuit board 8 and the second circuit board 9 are electrically and mechanically connected to each other.

However, if the pad portions 9c have a circular shape as shown in FIG. 10, stresses are concentrated on the tip ends 9f of the pad portions 9c at which the pad portions 9c and the conductive projections 81a make contact with each other. Therefore, the pad portions 9c may possibly be damaged when engaging and separating the first and second circuit boards 8 and 9 (see FIGS. 11A and 11B).

SUMMARY OF THE INVENTION

In view of the above, the present invention provides a female circuit board and a connector assembly capable of allowing two connection members to be engaged and separated with reduced likelihood of damage.

In accordance with a first embodiment of the invention, there is provided a female circuit board for use with a male circuit board having electrically conductive projections, including: a flexible insulating film including: insertion portions into which the conductive projections of the male circuit board are allowed to be inserted, each of the insertion portions including a plurality of slits communicating with each other at the center of each of the insertion portions; and electrically conduction portions for making contact with the conductive projections to come into conduction with the male circuit board, the conduction portions being disposed around the insertion portions on the surface of the female circuit board facing the male circuit board when the female circuit board is in contact with the male circuit board, the conduction portions conforming in shape to the insertion portions.

Each of the insertion portions may be of a shape extending radially from the center thereof. Each of the insertion portions may be point-symmetrical to the center thereof.

The female circuit board may further include a female base substrate arranged on a surface of the insulating film opposite to the surface on which the conduction portions is disposed. The female base substrate may be provided with through-holes at positions corresponding to the insertion portions.

In accordance with a second embodiment of the invention, there is provided a connector assembly, including: a female circuit board made from a flexible insulating film; and a male circuit board including conductive projections for coming into conduction with the female circuit board, wherein the female circuit board includes: insertion portions into which the conductive projections of the male circuit board can be inserted, each of the insertion portions including a plurality of slits communicating with one another at the center of each of the insertion portions; and conduction portions for making contact with the conductive projections and eventually coming into conduction with the male circuit board, the conduction portions being formed around the insertion portions on the surface of the female circuit board opposed to the male circuit board when the female circuit board is combined with the male circuit board, the conduction portions conforming in shape to the insertion portions.

With such configuration, it is possible to prevent stresses from concentrating on the contact portions of the conductive projections and the insertion portions when the conductive projections are inserted into or removed from the insertion portions. Accordingly, the female circuit board and the male circuit board can be combined together or separated from each other with reduced likelihood of damage.

BRIEF DESCRIPTION OF THE DRAWINGS

The objects and features of the present invention will become apparent from the following description of embodiments, given in conjunction with the accompanying drawings, in which.

DETAILED DESCRIPTION OF THE PREFERRED EMBODIMENTS

Figure 1:
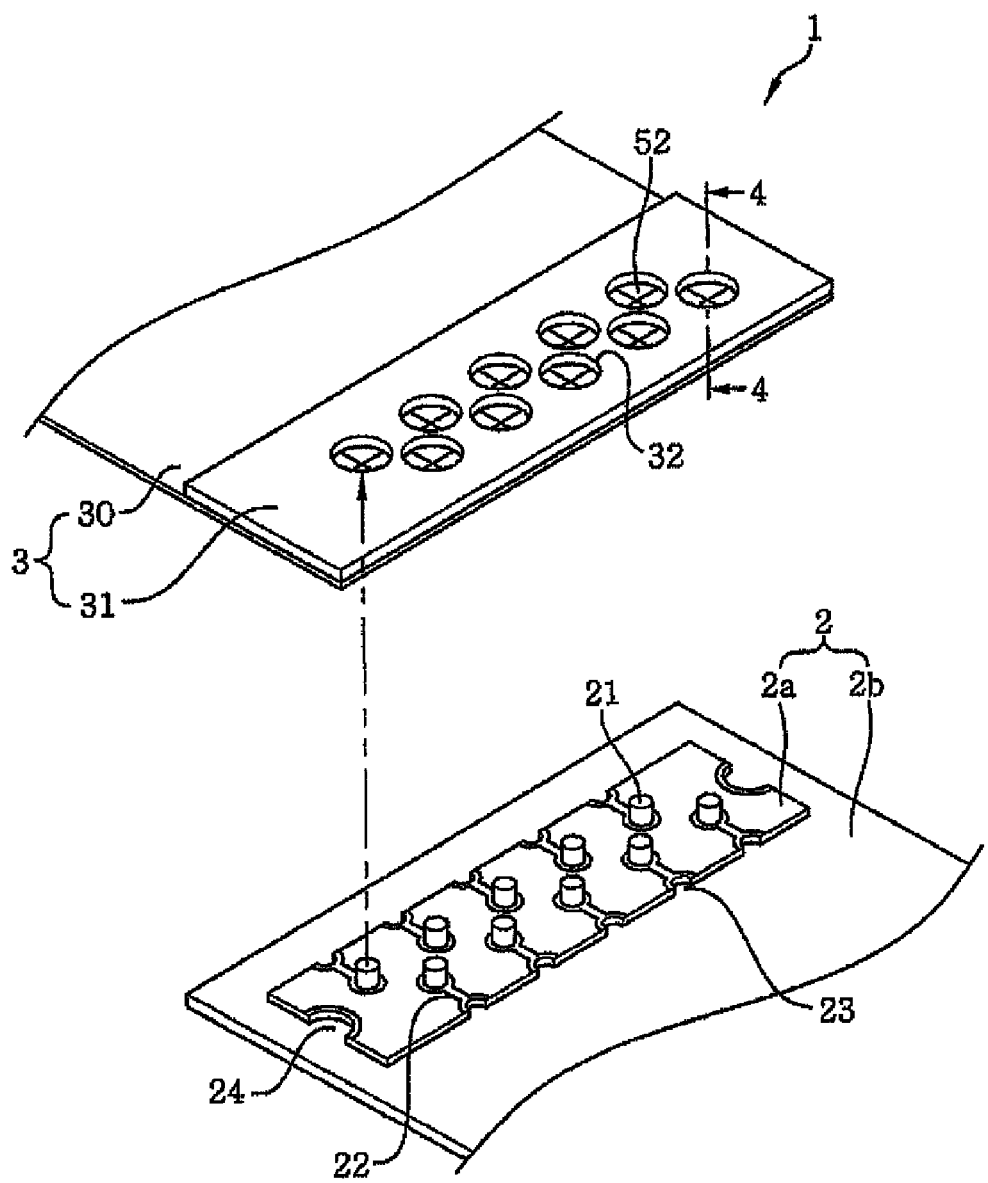
FIG. 1 is an exploded perspective view showing a connector assembly according to one embodiment of the present invention.
Figure 2:
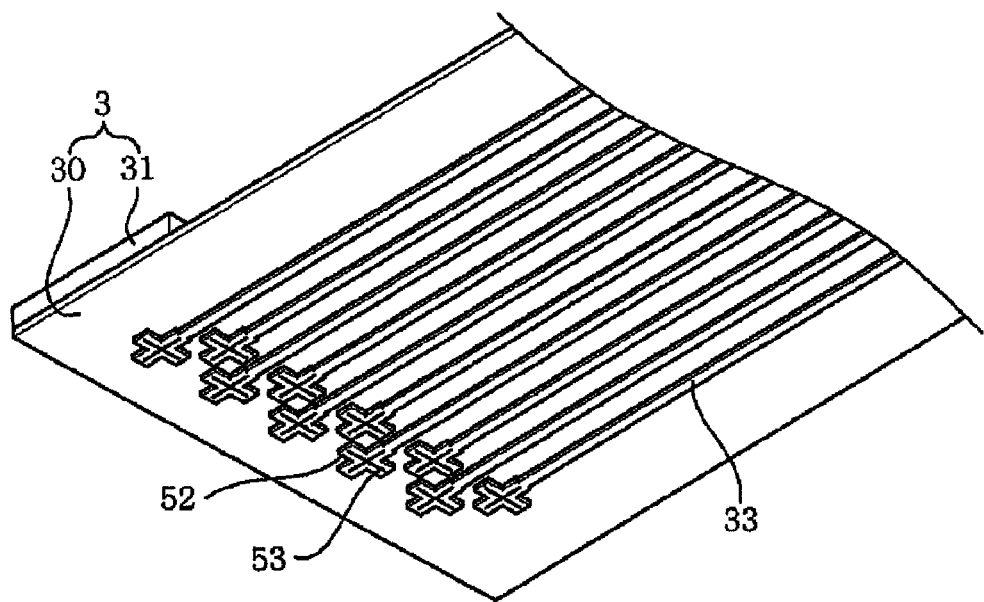
FIG. 2 is a perspective view showing a female circuit board according to one embodiment of the present invention.
Figure 3:
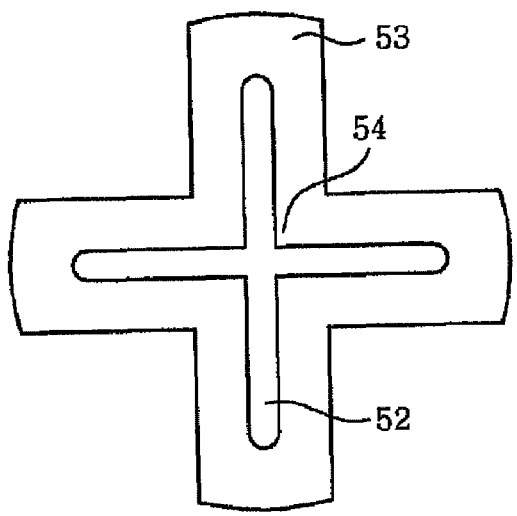
FIG. 3 is a plan view depicting the shape of an insertion portion and a conduction portion formed in the female circuit board according to one embodiment of the present invention.

Hereinafter, embodiments of the present invention will now be described with reference to the accompanying drawings which form a part hereof.

One Embodiment

As shown in FIGS. 1 to 4, the connector assembly 1 according to one embodiment of the present invention includes a first circuit board (or a male circuit board 2) and a second circuit board (or a female circuit board 3). The connector assembly 1 is formed by combining the male circuit board 2 and the female circuit board 3 together. In the connector assembly 1, the male circuit board 2 and the female circuit board 3 are electrically and mechanically connected to each other. The configurations of the respective circuit boards 2 and 3 will now be described in detail.

The male circuit board 2 includes a first male circuit board 2a and a second male circuit board 2b unified together.

The first male circuit board 2a is made from a flat substrate and includes a plurality of conductive projections 21 protruding from one surface thereof. The first male circuit board 2a further includes male circuit patterns 22 formed on one surface thereof to extend from the conductive projections 21 and male solder terminal portions 23 coming into conduction with the conductive projections 21 through the male circuit patterns 22. The first male circuit board 2a is made of an insulating material, e.g., a glass epoxy, and formed into a substantially rectangular plate shape. Solder portions 24 cut into a substantially semicircular shape and plated with, e.g., copper, are formed in the longitudinal opposite ends of the first male circuit board 2a.

The conductive projections 21 has a substantially rod-like shape and is made of a metallic material, e.g., copper. The conductive projections 21 are arranged along the longitudinal direction of the first male circuit board 2a in a staggering pattern with respect to one longitudinal side and the other longitudinal side of the first male circuit board 2a. The material of the conductive projections 21 is not limited to a metallic material such as copper or the like. In an alternative example, the conductive projections 21 may be formed by coating a metallic material on the surfaces of resin-molded portions.

The positions of the conductive projections 21 are not limited to the ones set forth above. In an alternative example, plural pairs of conductive projections 21 lying side by side in the transverse direction of the first male circuit board 2a may be arranged along the longitudinal direction of the first male circuit board 2a.

The male circuit patterns 22 are drawn from the conductive projections 21 and are formed to extend from the conductive projections 21 to the longitudinal side edges of the first male circuit board 2a. In this regard, the male circuit patterns 22 drawing from the conductive projections 21 arranged near a first longitudinal side are formed to extend toward the first longitudinal side. The male circuit patterns 22 drawing from the conductive projections 21 arranged near a second longitudinal side are formed to extend toward the second longitudinal side.

The male solder terminal portions 23 are formed by cutting out different portions of the respective longitudinal sides of the first male circuit board 2a into a substantially semicircular shape and plating the cutout portions with, e.g., copper. The male solder terminal portions 23 are connected to the male circuit patterns 22 and come into conduction with the conductive projections 21 through the male circuit patterns 22.

The first male circuit board 2a and the second male circuit board 2b having an electric circuit therein are unified together and connected to each other by soldering them at the solder portions 24 of the first male circuit board 2a. The first male circuit board 2a and the second male circuit board 2b are electrically connected to each other by electrically connecting the conductive projections 21 to the electric circuit of the second male circuit board 2b through the male circuit patterns 22 and the male solder terminal portions 23.

While the male circuit board 2 of the present embodiment is formed of the first male circuit board 2a and the second male circuit board 2b, the present invention is not limited to this configuration. In an alternative example, the male circuit board 2 may be formed of a single member or three or more members.

The female circuit board 3 includes a strip-shaped flexible insulating film 30 and a female base substrate 31 is arranged in one end of the insulating film 30. The female base substrate 31 has an substantially elongated rectangular plate shape and is made of a metal such as stainless steel or the like. The insulating film 30 and the female base substrate 31 are unified together by bonding one surface of the female base substrate 31 to one surface of the insulating film 30. While the female base substrate 31 of the present embodiment is made of a metal, the present invention is not limited thereto. In an alternative example, the female base substrate 31 may be an insulating substrate.

As the insulating film from which the insulating film 30 is made, it is possible to use an elastic base material made of, e.g., polyimide. In one end extension of the insulating film 30, insertion portions 52 are formed in alignment with the conductive projections 21 of the male circuit board 2. Each of the insertion portions 52 is formed of a substantially cross-shaped slit having four slit segments communicating with one another at the center point. In the present embodiment, the insertion portions 52 are arranged along the longitudinal direction of the female base substrate 31 in a staggering pattern with respect to one longitudinal side and the other longitudinal side of the female base substrate 31. In this manner, the formation positions of the insertion portions 52 are determined so that the insertion portions 52 of the insulating film 30 can be aligned with the conductive projections 21 of the first male circuit board 2a.

On the other surface of the insulating film 30, there are formed circuit patterns (hereinafter referred to as "conduction portions 53") conforming in shape to the slits serving as the insertion portions 52. The slits as the insertion portions 52 have a substantially cross-like shape and, therefore, are defined by four locking portions 54 formed of the insulating film and the conduction portions 53.

The conduction portions 53 of the present embodiment do not have a circular shape but have a shape provided with constrictions conforming to the slits as the insertion portions 52, namely a substantially cross-like shape point-symmetrical to the center of each of the insertion portions 52. Also formed on the other surface of the insulating film are female circuit patterns 33 drawing from the conduction portions 53 and extending along the longitudinal direction of the insulating film. In other words, the female circuit patterns 33 drawing from the conduction portions 53 arranged at one end of the insulating film 30 extend toward the other end of the insulating film 30 along the longitudinal direction of the insulating film. While the female circuit patterns 33 of the present embodiment are drawn from the conduction portions 53 to extend only in one direction, the present invention is not limited thereto. In an alternative example, the female circuit patterns 33 may be drawn to extend in the opposite directions about the conduction portions 53 along the longitudinal direction of the insulating film. In the following description, the surface of the insulating film 30 on which the conduction portions 53 are formed will be referred to as "mounting surface".

The conduction portions 53 and the female circuit patterns 33 are coated with a desired plating material. This helps enhance the strength and improve the mechanical and electrical connection in the male circuit board 2 and the female circuit board 3 combined together. Preferably, the plating material contains nickel. For example, such materials as nickel-tungsten, nickel-phosphorus, nickel-tin, nickel-cobalt and nickel-boron may preferably be used as the plating material. Among them, it is most preferable to use nickel-tungsten. In case where nickel-tungsten is used as the plating material, it is preferred in terms of coating strength that the content of tungsten be in a range of from 3 to 34 mass % based on the total mass of the components of the plating material. If the content of tungsten is less than 3 mass %, crystalline grains become greater in size, which may possibly lead to a reduction in strength. In contrast, if the content of tungsten is greater than 45 mass %, the ratio of non-crystallization grows higher, which may possibly result in a reduction in strength.

The female base substrate 31 has through-holes 32 pierced in a corresponding relationship with the insertion portions 52 of the insulating film 30. The female base substrate 31 is bonded to one end extension of the insulating film 30 and consequently unified with the insulating film 30. The female base substrate 31 unified with the insulating film 30 in this manner plays a role of a reinforcing plate for reinforcing the insulating film 30.

Figure 4:
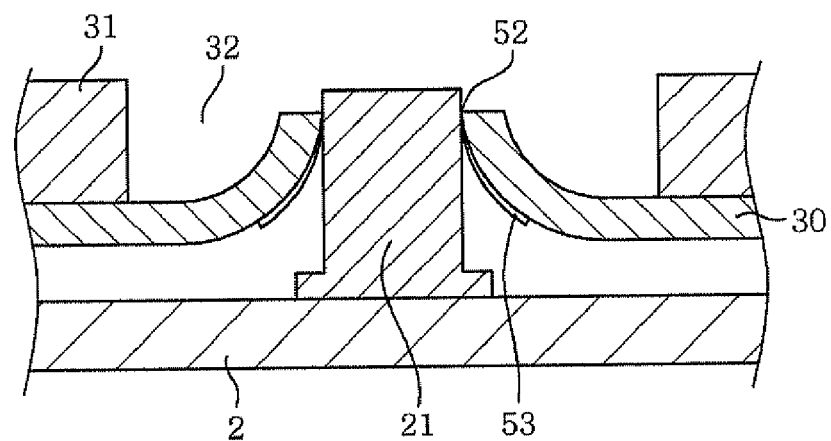
FIG. 4 is an enlarged partial section view along the section line 4-4 of FIG. 1, showing the major parts of the connector assembly according to one embodiment of the present invention.

In order to combine the male circuit board 2 and the female circuit board 3 together, the conductive projections of the male circuit board 2 are inserted into the insertion portions 52 at the side of the mounting surface of the insulating film 30. As a result, the conductive projections 21 are fitted to the insertion portions 52 as illustrated in FIG. 4 and come into conduction with the conduction portions 53, thereby electrically and mechanically interconnecting the male circuit board 2 and the female circuit board 3.

In the present embodiment, the conduction portions 53 conforming in shape to the slits as the insertion portions 52 are formed in the female circuit board 3. Therefore, as compared with the case where the conduction portions 53 has a circular shape, it is possible to adjust the ratio of stresses applied to the conduction portions 53 so that, when the female circuit board 3 is combined with the male circuit board 2, the stresses attributable to the elasticity of the insulating film can be applied to the root areas of the conduction portions 53 rather than the tip end areas thereof. This helps prevent the stresses from concentrating around the centers of the slits as the insertion portions 52 that make contact with the base ends of the conductive projections 21, i.e., on the tip ends of the locking portions 54. Moreover, it is possible to prevent the conduction portions 53 from being damaged when the male circuit board 2 and the female circuit board 3 are combined together or separated from each other, namely when the conductive projections 21 are inserted into or removed from the insertion portions 52.

Furthermore, the insertion portions 52 are formed to extend radially outwards from the centers of the slits as the insertion portions 52. In addition to the advantageous effects noted above, this makes it possible to easily perform the insertion and removal of the conductive projections 21 with respect to the insertion portions 52.

In addition, each of the insertion portions 52 is point-symmetrical to the center thereof so that, for example, all the locking portions 54 or the locking portions 54 opposed to each other can have the same shape. This makes it possible to apply stresses to the respective locking portions 54 in a balanced manner. Consequently, the stresses applied to the respective locking portions 54 can be equalized not only in the directions running from the tip ends of the locking portions 54 toward the roots thereof but also in the circumferential direction running about the center of each of the slits as the insertion portions 52.

Other Embodiments

Other embodiments of the present invention will now be described. In the following description, the same components as those of the foregoing embodiment will be designated by like reference numerals without making detailed description thereon. Only the components differing from those of the foregoing embodiment will be described in detail.

FIGS. 5 through 8B are plan views showing the shapes of the insertion portions 52 and the conduction portions 53 of the female circuit boards 3 according to other embodiments of the present invention.

Figure 5:
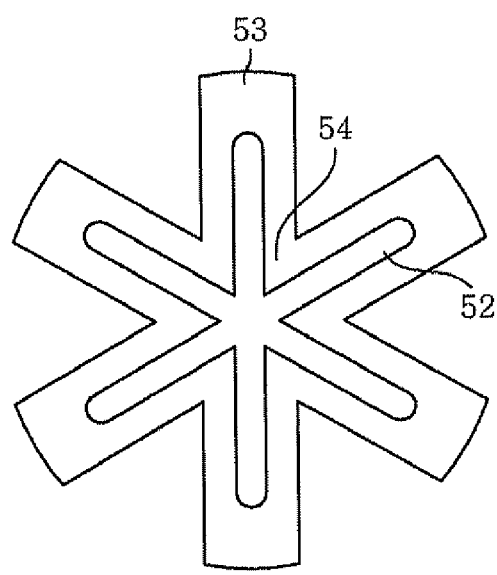
FIG. 5 is a plan view depicting the shape of an insertion portion and a conduction portion formed in female circuit board according to another embodiment of the present invention.

The insertion portion 52 shown in FIG. 5 is formed to radially extend from the center in six directions. As compared with the substantially cross-shaped insertion portion 52 employed in the foregoing embodiment, the insertion portion 52 shown in FIG. 5 has an increased number of slit segments and hence an increased number of locking portions 54. In the female circuit board 3 including the insertion portion 52 and the conduction portion 53 shown in FIG. 5, it is possible for the locking portions 54 to hold each of the conductive projections 21 from many different directions, thereby reducing the stresses applied to each of the locking portions 54. This keeps the locking portions 54 hard to break and enhances the contact reliability of the locking portions 54 and the conductive projections 21.

Figure 6A:
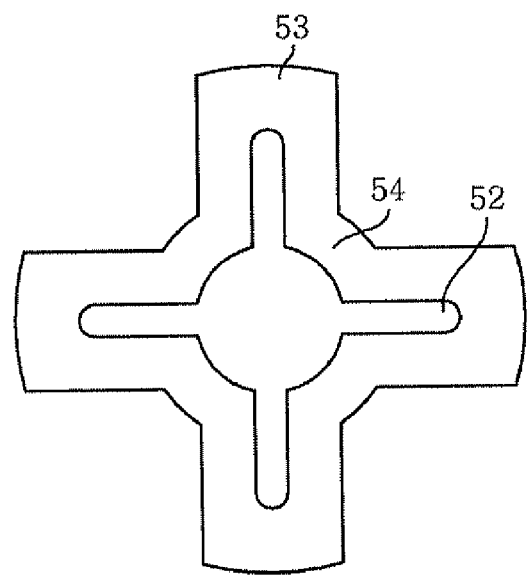
FIGS. 6A and 6B are plan views depicting the shape of an insertion portion and a conduction portion formed in a female circuit board according to a further embodiment of the present invention.

The insertion portion 52 shown in FIG. 6A is formed by combining a circular hole defined at the center of the insertion portion 52 and rectilinear slits extending radially from the center of the insertion portion 52 in four directions.

Figure 6B:
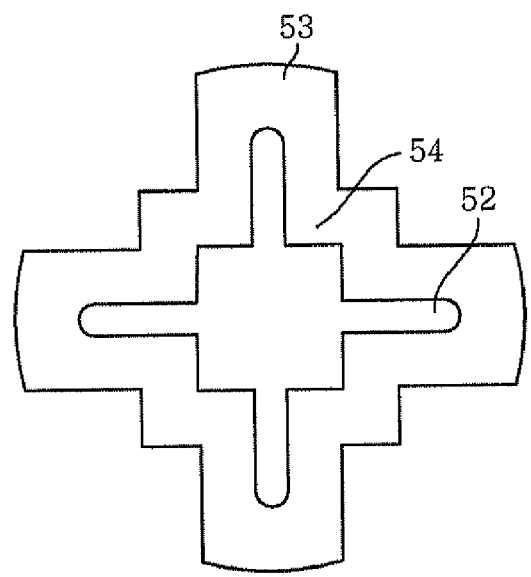

With the insertion portion 52 of this shape, it is possible to easily perform the insertion of the conductive projections 21 into the insertion portions 52 and the removal of the conductive projections 21 from the insertion portions 52. Moreover, it is possible to maintain a good connection state even when repeatedly performing the insertion of the conductive projections 21 into the insertion portions 52 and the removal of the conductive projections 21 from the insertion portions 52. The shape of the hole defined at the center of the insertion portion 52 is not limited to the circular one. In an alternative example, the hole may have a square shape as illustrated in FIG. 6B.

Figure 7A:
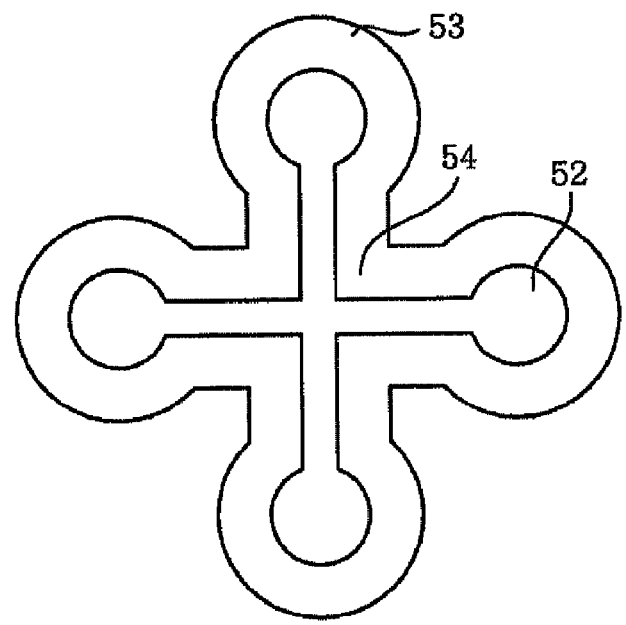
FIGS. 7A and 7B are plan views depicting the shape of an insertion portion and a conduction portion formed in a female circuit board according to a still further embodiment of the present invention.
Figure 7B:
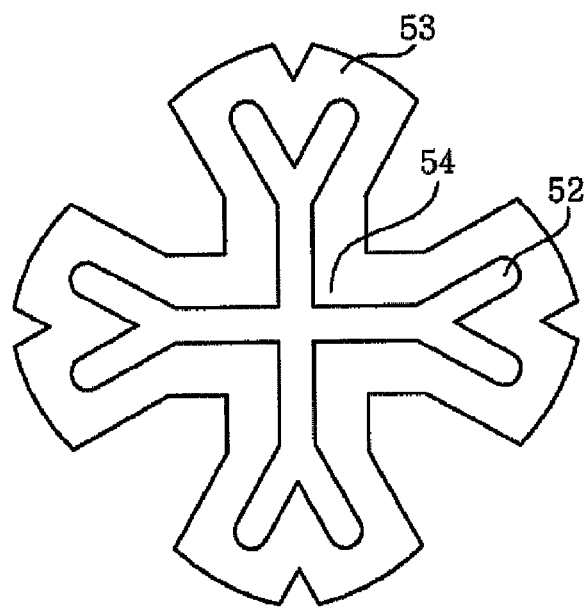

The insertion portion 52 shown in FIG. 7A is formed by combining rectilinear slits extending radially from the center of the insertion portion 52 in four directions and circular holes defined at the tip ends of the slits. With the insertion portion 52 of this shape, it is possible to easily perform the insertion of the conductive projections 21 into the insertion portions 52 and the removal of the conductive projections 21 from the insertion portions 52. Moreover, it is possible to maintain a good connection state even when repeatedly performing the insertion of the conductive projections 21 into the insertion portions 52 and the removal of the conductive projections 21 from the insertion portions 52. The shape of the holes defined at the tip ends of the slits is not limited to the circular one. In an alternative example, the holes may have a V-shaped cutout shape as illustrated in FIG. 7B.

Figure 8A:
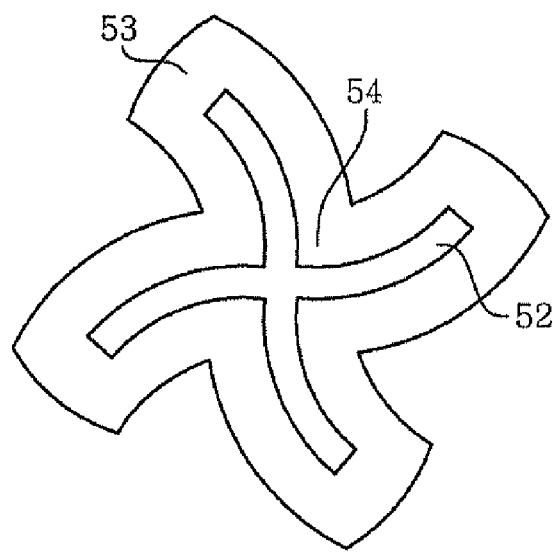
FIGS. 8A and 8B are plan views depicting the shape of an insertion portion and a conduction portion formed in a female circuit board according to a yet still further embodiment of the present invention.
Figure 8B:
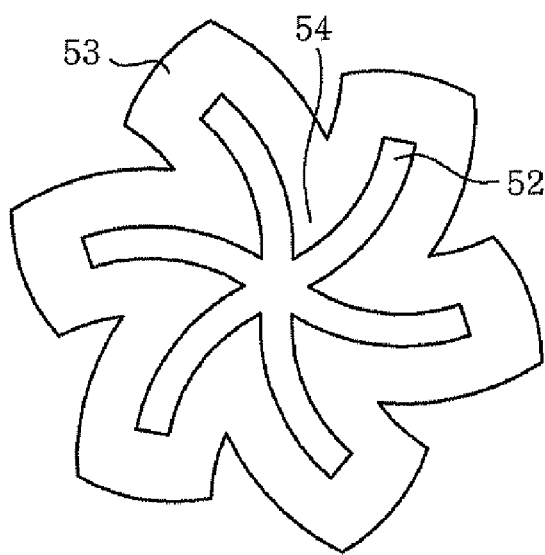
Figure 9:
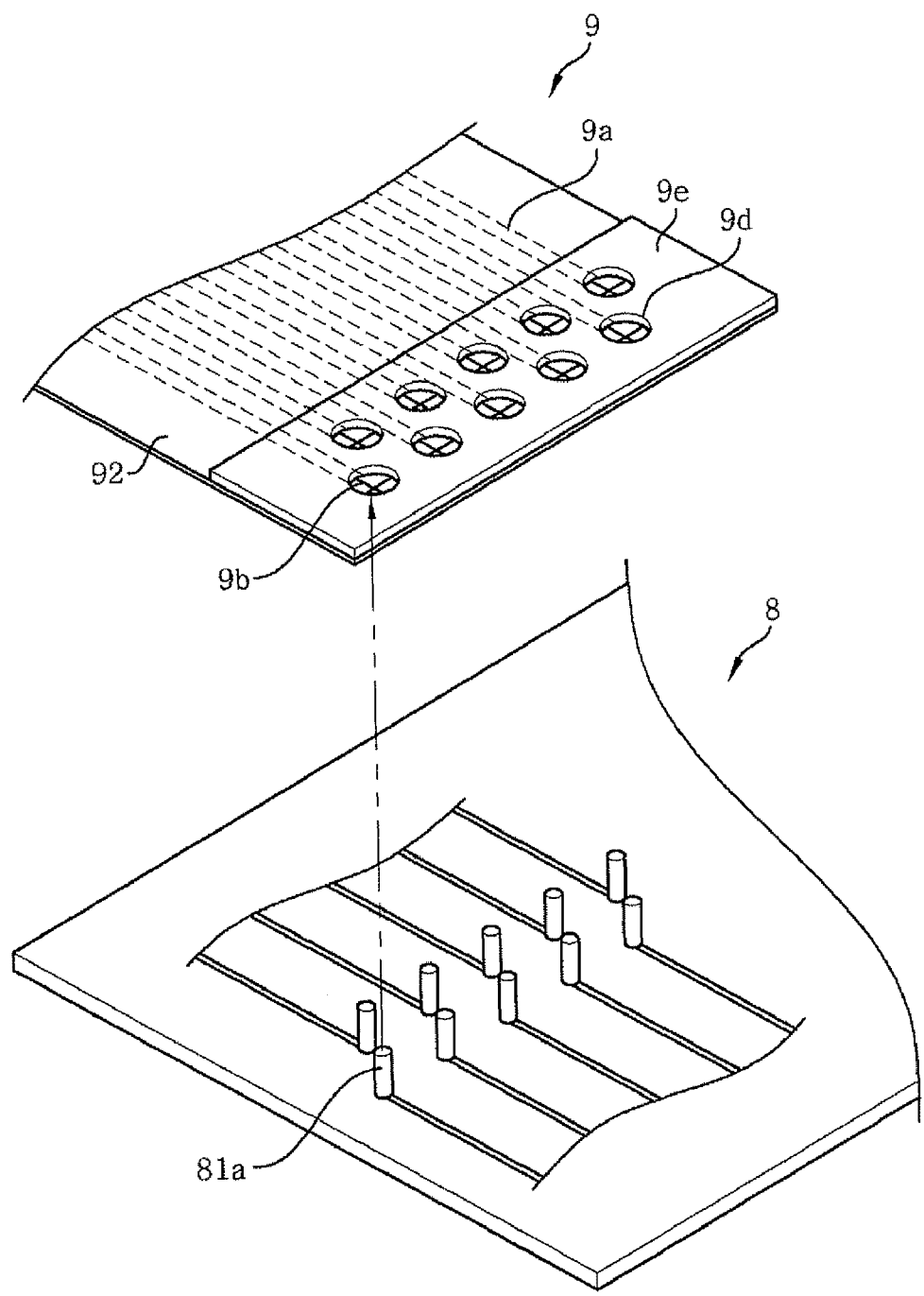
FIG. 9 is a perspective view showing the structure of a conventional connector assembly.
Figure 10:
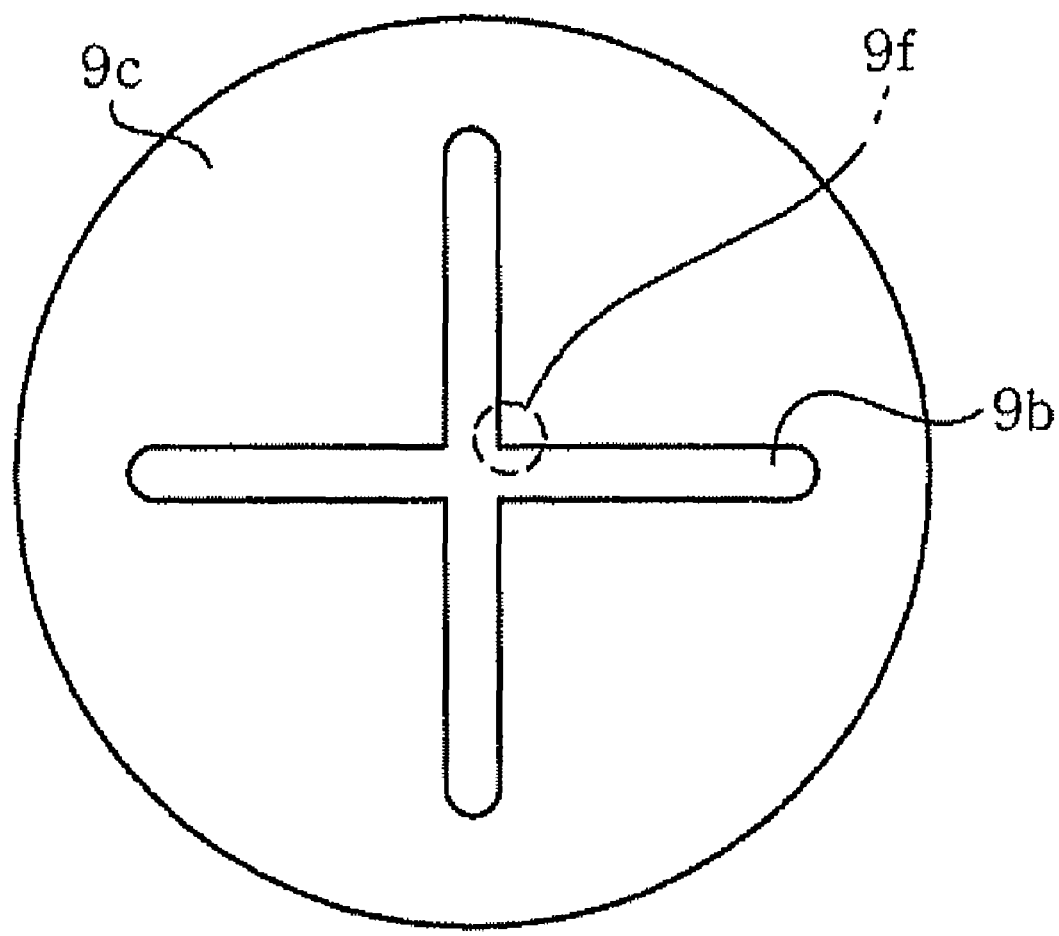
FIG. 10 is a plan view depicting the shape of a slit portion and a pad portion formed in a conventional female circuit board.
Figure 11A:
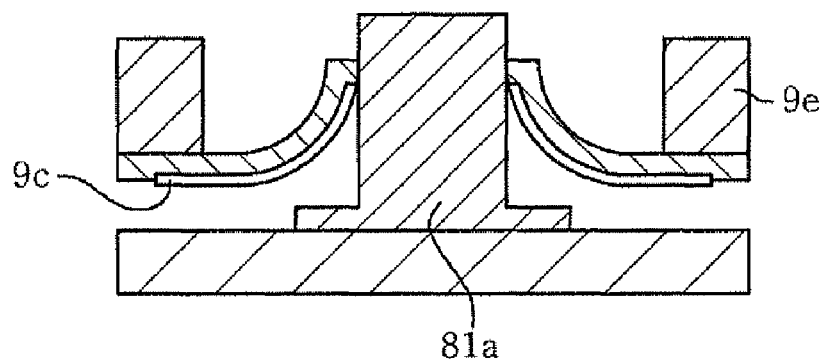
FIGS. 11A and 11B are enlarged section views showing the major parts of the conventional connector assembly.
Figure 11B:
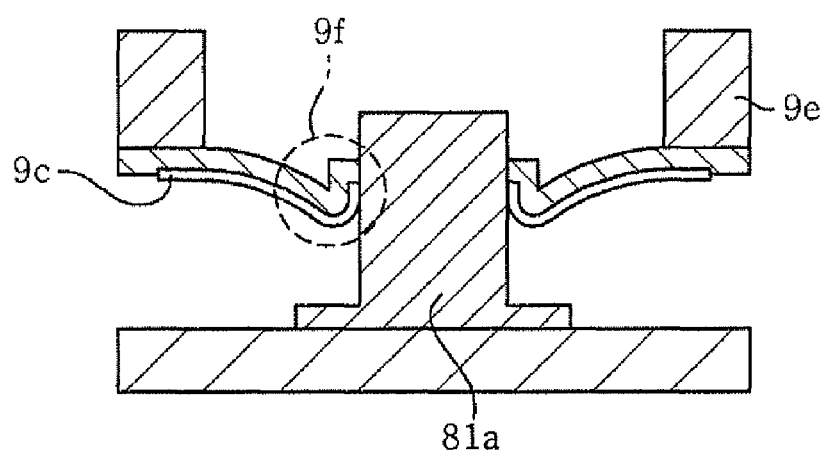

The insertion portion 52 shown in FIG. 8A is formed of curvilinear slits extending from the center of the insertion portion 52 in four directions. With the insertion portion 52 of this shape, the length of one side of each of the locking portions 54 becomes longer than the length of the other side. This makes it possible to improve the flexibility of the locking portions 54 and to enhance the contact reliability of the locking portions 54 and the conductive projections 21. The number of the curvilinear slits is not limited to the one illustrated in FIG. 8A. In an alternative example, the curvilinear slits may extend in six directions as shown in FIG. 8B.

While certain embodiments of the present invention have been described hereinabove, the present invention is not limited to these embodiments but may be modified in many different forms without departing from the scope of the invention.

What is claimed is:

1. A female circuit board for use with a male circuit board having electrically conductive projections, comprising:
    a flexible insulating film including:
    insertion portions into which the conductive projections of the male circuit board are allowed to be inserted, each of the insertion portions including a plurality of slits communicating with each other at a center of each of the insertion portions; and
    electrically conduction portions for making contact with the conductive projections to come into conduction with the male circuit board,
    wherein the conduction portions are disposed around the insertion portions on a surface of the female circuit board, the surface facing the male circuit board when the female circuit board is in contact with the male circuit board, and
    wherein the conduction portions do not have a circular shape and conform in shape to the insertion portions.

2. The female circuit board of claim 1, wherein each of the insertion portions is of a shape extending radially from the center thereof.

3. The female circuit board of claim 1, wherein each of the insertion portions is point-symmetrical to the center thereof.

4. The female circuit board of claim 2, wherein each of the insertion portions is point-symmetrical to the center thereof.

5. The female circuit board of claim 1, further comprising a female base substrate arranged on a surface of the insulating film opposite to the surface on which the conduction portions is disposed, the female base substrate being provided with through-holes at positions corresponding to the insertion portions.

6. The female circuit board of claim 2, further comprising a female base substrate arranged on a surface of the insulating film opposite to the surface on which the conduction portions is disposed, the female base substrate being provided with through-holes at positions corresponding to the insertion portions.

7. The female circuit board of claim 3, further comprising a female base substrate arranged on a surface of the insulating film opposite to the surface on which the conduction portions is disposed, the female base substrate being provided with through-holes at positions corresponding to the insertion portions.

8. The female circuit board of claim 4, further comprising a female base substrate arranged on a surface of the insulating film opposite to the surface on which the conduction portions is disposed, the female base substrate being provided with through-holes at positions corresponding to the insertion portions.

9. The female circuit board of claim 1, wherein outer peripheries of the conduction portions conform in shape to the insertion portions.

10. A connector assembly, comprising:
    a female circuit board made from a flexible insulating film; and
    a male circuit board including conductive projections for coming into conduction with the female circuit board,
    wherein the female circuit board comprises:
    insertion portions into which the conductive projections of the male circuit board can be inserted, each of the insertion portions including a plurality of slits communicating with one another at a center of each of the insertion portions; and
    conduction portions for making contact with the conductive projections and eventually coming into conduction with the male circuit board,
    wherein the conduction portions are formed around the insertion portions on the surface of the female circuit board, the surface opposed to the male circuit board when the female circuit board is combined with the male circuit board, and
    wherein the conduction portions do not have a circular shape and conform in shape to the insertion portions.

11. The connector assembly of claim 10, wherein each of the insertion portions is of a shape extending radially from the center thereof.

12. The connector assembly of claim 10, wherein each of the insertion portions is point-symmetrical to the center thereof.

13. The connector assembly of claim 10, further comprising a female base substrate arranged on a surface of the insulating film opposite to the surface on which the conduction portions is disposed, the female base substrate being provided with through-holes at positions corresponding to the insertion portions.

14. The connector assembly of claim 10, wherein outer peripheries of the conduction portions conform in shape to the insertion portions.

* * * * *